(12) United States Patent
Yokoyama et al.

(10) Patent No.: US 6,429,471 B1
(45) Date of Patent: Aug. 6, 2002

(54) COMPOUND SEMICONDUCTOR FIELD EFFECT TRANSISTOR AND METHOD FOR THE FABRICATION THEREOF

(75) Inventors: Takahiro Yokoyama, Hyogo; Hidetoshi Ishida, Kyoto; Yorito Ota, Hyogo; Daisuke Ueda, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/578,712

(22) Filed: May 26, 2000

(30) Foreign Application Priority Data

Jun. 1, 1999 (JP) ............................................ 11-154276

(51) Int. Cl.$^7$ ................................................. H01L 29/76
(52) U.S. Cl. ..................... 257/289; 257/200; 257/279; 257/609; 257/631; 257/743; 438/602; 438/604
(58) Field of Search ........................... 257/11, 102, 189, 257/200, 279, 289, 425, 609, 631, 743, 744, 745; 438/602, 604

(56) References Cited

U.S. PATENT DOCUMENTS

| 4,394,674 A | 7/1983 | Sakuma et al. ............. 257/336 |
| 5,040,037 A | 8/1991 | Yamaguchi et al. |
| 6,028,348 A | * 2/2000 | Hill ............................. 257/666 |

FOREIGN PATENT DOCUMENTS

| EP | 0 104 754 | 4/1984 | |
| EP | 0 622 852 A1 | 11/1994 | |
| EP | 000622852 A1 | * 11/1994 | ........... H01L/29/10 |
| GB | 2285884 A | * 7/1995 | ........... H01L/29/78 |
| GB | 2 285 884 | 7/1995 | |
| JP | 57 211778 | 12/1982 | |
| JP | 61 156857 | 7/1986 | |
| JP | 02159767 | 6/1990 | |
| JP | 04 372138 | 12/1992 | |
| JP | 2510710 | 4/1996 | |

OTHER PUBLICATIONS

European Search Report dated Sep. 27, 2000.
M. Nagaoka et al., "High Efficiency, Low Adjacent Channel Leakage 2–V Operation GaAs Power Mesfet Amplifier for 1.9–GHZ Digital Cordless Phone System", 1997 IEEE MTT–S Digest, pp. 1323–1326.

* cited by examiner

Primary Examiner—Nathan J. Flynn
Assistant Examiner—Scott R Wilson
(74) Attorney, Agent, or Firm—Nixon Peabody LLP; Donald R. Studebaker

(57) ABSTRACT

Disclosed is a compound semiconductor field effect transistor. The compound semiconductor field effect transistor has a charge absorption layer and a semiconductor laminated structure. The charge absorption layer includes a compound semiconductor layer of a first conductive type formed in a part of a compound semiconductor substrate having a semi-insulating layer. The semiconductor laminated structure includes at least an active layer including a compound semiconductor layer of a second conductive type epitaxially grown so as to cover the charge absorption layer and a region of the semi-insulating surface where the charge absorption layer is not formed. A source electrode is formed on the semiconductor laminated structure, being electrically connected to the charge absorption layer.

3 Claims, 14 Drawing Sheets

COMPOUND SEMICONDUCTOR FIELD EFFECT TRANSISTOR AND METHOD FOR THE FABRICATION THEREOF

BACKGROUND OF THE INVENTION

The present invention generally relates to compound semiconductor field effect transistors and, more particularly, to compound semiconductor field effect transistors suitable for high output power.

Field effect transistors using compound semiconductor, hereinafter referred to as compound FETs, have been used as a high frequency transistor in the field of mobile communication. Generally, the compound FET is implemented in the form of MESFET (Metal Semiconductor FET) or in the form of MISFET (Metal Semiconductor Insulator FET). This is because, unlike the case of using silicon, it is impossible to prepare a MOSFET since it is extremely difficult to form, on a surface of a compound semiconductor substrate, an oxide film capable of providing a semiconductor-insulator junction which is stable and whose surface order is low. Accordingly, whereas a silicon FET is formed on a conductive substrate, a MESFET or MISFET is formed by the use of an insulating compound semiconductor substrate or semi-insulating compound semiconductor substrate. Hereinafter, throughout the specification, by the term "semi-insulating" is meant at lest "semi-insulation" and the term includes also "insulation".

The way of fabricating a compound FET is divided, in terms of how its semiconductor layer is formed, roughly into two types, namely a method which employs ion implantation and another which employs epitaxial growth. The epitaxial growth process has several advantages over the ion implantation process. One of the advantage is that it is possible to form semiconductor layers high in impurity concentration and thin in film thickness, thereby making it possible to provide high-gain compound FETs. Another advantage is that, in MISFET, such a structure that the gate is not brought into direct contact with an active (operational) layer can be formed by using a high-purity intrinsic compound semiconductor layer (e.g., a non-dope aluminum gallium arsenic (i-AlGaAs)) as a gate contact layer, thereby allowing the realization of FETs capable of high current drive while at the same time securing a high breakdown voltage with no sacrifice in breakdown voltage, which is difficult for the ion implantation process to achieve. Owing to these advantages over the ion implantation process, there has been more need for epitaxially-grown compound FETs capable of serving as a high-frequency high output power FET for use in, for example, portable telephone power amplifiers.

Based on the phenomenon that the width of a depletion layer that is formed in an active layer (which is also called an electron transit layer or a channel) formed over a semi-insulating compound semiconductor substrate varies according to the level of the gate voltage, the compound FET controls a source-drain current. However, since the active layer is formed on the semi-insulating substrate, this will give rise to a problem of causing the compound FET to vary in its current-voltage characteristic (the I-V characteristic) when a high electric field is internally created.

The cause of such FET I-V characteristic variation will be discussed below.

Upon creation of a high electric field in the inside of a compound FET, electrons are accelerated by the high electric field to come to have high energy. When such a high energy electron collides with the lattice, this creates an electron-hole pair (an ion), which phenomenon is called "impact ionization". Typically, the active layer is an n-type compound semiconductor layer and, of the created electron-hole pair, the electron merges with a carrier of the active layer and then flows to the high potential side, that is, towards the drain. On the other hand, the created holes are injected into the substrate. As a result, the potential of the substrate increases and the injected holes are accumulated around under a gate of the substrate. Due to the influence of the holes, the width of a depletion layer in the active layer varies, and there occurs a change in the FET current-voltage characteristic.

FIGS. 15A and 15B each show a band structure for a gate electrode 76, an active layer (n-GaAs) 74, and a semi-insulating substrate (i-GaAs) 72 in an n-type gallium arsenic (GaAs)-including MESFET. FIG. 15A shows a state immediately after an electron-hole pair has been created by impact ionization. FIG. 15B shows an approximately stable state after a definite period of time has elapsed since the electron-hole pair creation. As can be seen from FIG. 15A, of the electron-hole pairs created in the active layer 74, the holes are liable to accumulate under the gate electrode along the potential surface of VB (valence band) or enter into the substrate 72. Upon injection of the holes into the substrate 72, the electric potential of the semi-insulating substrate 72, which is in agreement with a Fermi level ($E_F$) in FIG. 15A, increases by an amount of $\Delta V_{sub}$ as shown in FIG. 15B. As a result, the width of the depletion layer 75 that is formed between the active layer 74 and the substrate 72 becomes narrower than that of FIG. 15A. Such a reduction in the depletion layer width caused by the holes being injected into the semi-insulating substrate 72 is similar to the phenomenon that the depletion layer width is reduced when there is an increase in the p-type impurity concentration in a P/N contact. A reduction in the width of a depletion layer below the gate electrode 76 means that the region that contributes to conduction within the active layer 74 will increase, so that there is an increase in the drain current even when both the gate voltage and the drain voltage are constant. Such a phenomenon appears as a kink (bent) 78 in the I-V curve, as shown in FIG. 16.

Referring now to FIGS. 16A and 16B, there are graphically shown I-V curves for different gate voltages of the compound FET, wherein the abscissa indicates the drain voltage and the ordinate the drain current. Whereas FIG. 16A shows an ideal I-V curve, FIG. 16B shows a conventional FET I-V curve. As described above, if the depletion layer width is narrowed by holes and the region that contributes to conduction within the active layer 74 increases, this results in a sudden increase in the drain current. As a result, the I-V curve bends, in other words the kink 78 is produced. Accordingly, in the vicinity of such a kink in the I-V curve, it is impossible to obtain a desired drain current even when performing control of the gate and drain voltages. Moreover, as the drain current varies, generally the FET optimum matching impedance varies considerably. This means that a FET that suffers a kink cannot be served as a high frequency power amplification FET the important requirement for which is impedance matching.

In order to obtain high-frequency high output power FETs, the realization of a high breakdown voltage (i.e., a high gate breakdown voltage) has been demanded, together with the controlling of the creation of kinks in the I-V curve.

An example of the kink creation control in MESFET is disclosed by M. Nagaoka et. al., in their paper entitled "High efficiency, low adjacent channel leakage 2-V operation GaAs power MESFET amplifier for 1.9 GHz digital cordless phone system", IEEE MTT-S Digest, pp.1323–1326, 1997. Referring to FIG. 17, there is schematically illustrated a MESFET 1200 disclosed in the document.

The MESFET 1200 has a semi-insulating substrate 82 formed of i-GaAs, an n-type active layer 86 formed by implantation of ions into the semi-insulating substrate 82, and three different electrodes (i.e., a source electrode 87, a drain electrode 88, and a gate electrode 89) which are formed on their respective regions over the n-type active layer 86. The n-type active layer 86 has an n-type compound semiconductor layer 86c formed below the gate electrode 89, an n-type compound semiconductor layer 86b formed adjacent to each side of the n-type compound semiconductor layer 86c, and an n$^+$ semiconductor layer 86a for the establishment of ohmic contact with each of the source electrode 87c and the drain electrode 88. Further, p-type compound semiconductor layers 84s and 84d are formed by ion implantation below the n$^+$ semiconductor layers 86a formed under the source electrode 87 and under the drain electrode 88, respectively, in other words they are formed on the substrate side.

A part of holes created by impact ionization taking place within the n-type active layer 86 passes through the gate electrode 89 and is emitted to outside the compound FET 1200 in the form of gate current. On the other hand, the remaining holes are not accumulated in the semi-insulating substrate 82, but they are accumulated in the p-type compound semiconductor layer 84s on the source side (the reason is that no hole is accumulated in the p-type compound semiconductor layer 84d on the drain side because a positive voltage is applied to a drain electrode of the FET having an n-type active layer).

Moreover, even when holes are accumulated in the p-type compound semiconductor layer 84s, the width of a depletion layer that is formed between the p-type compound semiconductor layer 84s and the n$^+$ semiconductor layer 86a will hardly vary because the n-type impurity concentration of the n$^+$ semiconductor layer 86a formed just above the p-type compound semiconductor layer 84s is sufficiently high. As a result, the semi-insulating substrate 82 hardly varies in electric potential. Accordingly, even when holes are created in the compound FET 1200, the width of a depletion layer that is formed between the n-type active layer 86 and the semi-insulating substrate 82 is not varied, so that no kink will occur in the I-V curve.

However, the MESFET disclosed in the foregoing document is prepared by an ion implantation process, so that, as discussed above, it is difficult to make high current drive capability compatible with high breakdown voltage. This prior art MESFET is therefore not suitable for high output power at high frequencies.

FIG. 18 schematically shows in cross section a structure of a typical MISFET 1300. The MISFET 1300 has an epitaxially-grown aluminum gallium arsenic (AlGaAs)/GaAs heterojunction. The MISFET 1300 has a semi-insulating substrate 92 (GaAs), a buffer layer 92a (i-GaAs), an n-type compound semiconductor layer 94 (n-GaAs) which is an active layer, a semi-insulating compound semiconductor layer 95 (i-Al$_{0.2}$Ga$_{0.8}$As) which functions as an insulating layer, and a contact layer 96 (n-GaAs), these layers being formed in that order on the semi-insulating substrate 92. Both a source electrode 97 and a drain electrode 98 are formed on the contact layer 96, while a gate electrode 99 is located above the semi-insulating compound semiconductor layer 95.

Upon creation of holes in the active layer 94 of the MISFET 1300 by impact ionization, like the MESFET, a part of the holes is injected into the semi-insulating substrate 92 (which includes the buffer layer 92a which is semi-insulating). This causes the potential of the substrate 92 to increase, as a result of which the width of a depletion layer between the n-type compound semiconductor layer 94 and the semi-insulating substrate 92 narrows and there is an increase in the drain current. In addition to this, in the MISFET 1300, a part of the holes is accumulated in the surface of the semi-insulating compound semiconductor layer 95, as a result of which the width of a surface depletion layer that is formed between the source and gate narrows and there is an increase in the drain current. This state will be described by making reference to FIG. 19. FIG. 19 depicts a band structure under the gate electrode 99 of the MISFET 1300. A part of holes that have been created within the n-GaAs layer 94 by impact ionization travels along the potential surface of VB (valence band) and is accumulated at a heterojunction interface between the i-AlGaAs layer 95 and the n-GaAs layer 94. Further, a part of the accumulated holes moves past the heterojunction and is accumulated in the surface of the semi-insulating compound semiconductor layer 95 (i.e., the interface with the gate electrode 99). As a result, the width of a surface depletion layer that is formed between the source and gate narrows and there is an increase in the drain current.

As described above, there have been proposed a way of controlling the variation in compound FET I-V characteristic (the occurrence of kinks); however, such proposals are limited to MESFETs fabricated by ion implantation.

Unfortunately, there has not yet been developed any control method of controlling the variation in the compound FET I-V characteristic of compound FETs (particularly MISFETs) fabricated by epitaxial growth having an expectant future of application.

The present invention was made with a view to providing a solution to the above-described problem. Accordingly, an object of the present invention is to provide a compound FET capable of achieving high output power in a high frequency region and a method for the fabrication of such a compound FET.

SUMMARY OF THE INVENTION

The present invention provides a compound semiconductor field effect transistor comprising (a) a compound semiconductor substrate having a semi-insulating surface, (b) a charge absorption layer including a compound semiconductor layer of a first conductive type formed in a part of the compound semiconductor substrate, (c) a semiconductor laminated structure including at least an active layer having a compound semiconductor layer of a second conductive type epitaxially grown so as to cover the charge absorption layer and a region of the semi-insulating surface where the charge absorption layer is not formed, (d) a source electrode formed on the semiconductor laminated structure located above the charge absorption layer, the source electrode being electrically connected to the charge absorption layer, (e) a drain electrode formed on the semiconductor laminated structure located above the region where the charge absorption layer is not formed, and (f) a gate electrode formed between the source electrode and the drain electrode, whereby the foregoing object can be achieved.

The present invention provides an arrangement in which the compound semiconductor field effect transistor further comprises (a) an additional electrode formed on the semiconductor laminated structure, (b) an ohmic contact region extending from the additional electrode to the charge absorption layer through semiconductor laminated structure, and (c) a connection electrode electrically connecting the additional electrode and the source electrode.

The present invention provides an arrangement in which the compound semiconductor field effect transistor further comprises (a) a contact hole formed in a part of the semiconductor laminated structure, the contact hole extending to the charge absorption layer, (b) an additional electrode electrically connected to the charge absorption layer in the contact hole, and (c) a connection electrode electrically connecting the additional electrode and the source electrode.

The present invention provides an arrangement in which (a) the compound semiconductor field effect transistor further comprises a further compound semiconductor layer of the second conductive type formed on the charge absorption layer and (b) the semiconductor laminated structure is formed so as to cover the charge absorption layer, the further compound semiconductor layer of the second conductive type, and the region where the charge absorption layer is not formed.

The present invention provides a method for the fabrication of a compound semiconductor field effect transistor comprising the steps of (i) providing a compound semiconductor substrate having a semi-insulating surface, (ii) forming, in a part of the compound semiconductor substrate, a charge absorption layer including a compound semiconductor layer of a first conductive type, (iii) epitaxially growing a semiconductor laminated structure including at least an active layer having a compound semiconductor layer of a second conductive type, so as to cover the charge absorption layer and a region of the semi-insulating surface where the charge absorption layer is not formed, (iv) forming a source electrode electrically connected to the charge absorption layer on the semiconductor laminated structure located above the charge absorption layer, (v) forming a drain electrode on the semiconductor laminated structure located above the region where the charge absorption layer is not formed, and (vi) forming a gate electrode between the source electrode and the drain electrode, whereby the foregoing object can be achieved.

The present invention provides an arrangement in which the charge absorption layer formation step includes selectively implanting impurity ions of the first conductive type into a predetermined region of the compound semiconductor substrate.

The present invention provides an arrangement in which the charge absorption layer formation step includes (i) epitaxially growing the compound semiconductor layer of the first conductive type on the semi-insulating surface of the compound semiconductor substrate, and (ii) patterning the compound semiconductor layer of the first conductive type into a predetermined shape.

The present invention provides an arrangement in which (a) the semiconductor laminated structure formation step includes (i) epitaxially growing the active layer, (ii) epitaxially growing an intrinsic compound semiconductor layer on the active layer, and (iii) epitaxially growing on the intrinsic compound semiconductor layer a contact layer having a compound semiconductor layer of the second conductive type, (b) the drain electrode formation step includes (i) forming a drain electrode on the contact layer, and (ii) forming an ohmic contact region between the drain electrode and the contact layer, and (c) the gate electrode formation step includes (i) removing a part of the contact layer so as to expose a part of the intrinsic compound semiconductor layer and (ii) forming a gate electrode on the exposed part of the intrinsic compound semiconductor layer.

The present invention provides an arrangement in which the source electrode formation step includes thermally diffusing a metallic material of the source electrode to form an ohmic contact region extending from the source electrode to the charge absorption layer through the semiconductor laminated structure.

The present invention provides an arrangement in which the source electrode formation step includes (i) forming on the semiconductor laminated structure an additional electrode of a metallic material, (ii) thermally diffusing the additional electrode metallic material to form an ohmic contact region extending from the additional electrode to the charge absorption layer through the semiconductor laminated structure, and (iii) forming a connection electrode electrically connecting the additional electrode and the source electrode.

The present invention provides an arrangement in which the source electrode formation step includes (i) forming, in a part of the semiconductor laminated structure, a contact hole extending to the charge absorption layer, (ii) forming an additional electrode being in direct contact with the charge absorption layer in the contact hole, (iii) forming a source electrode on the semiconductor laminated structure, and (iv) forming a connection electrode electrically connecting the additional electrode and the source electrode.

The present invention provides an arrangement in which (a) the compound semiconductor field effect transistor fabrication method further comprises (i) forming on the charge absorption layer a further compound semiconductor layer of the second conductive type and (ii) patterning the second compound semiconductor layer of the second conductive type into the same shape as the charge absorption layer and (b) the semiconductor laminated structure formation step is a step of forming the semiconductor laminated structure so as to cover the charge absorption layer, the patterned second compound semiconductor layer of the further conductive layer, and the region where the charge absorption layer is not formed.

The present invention provides an arrangement in which (a) the compound semiconductor field effect transistor fabrication method further comprises (i) forming on the charge absorption layer a second compound semiconductor layer of the further conductive type and (ii) patterning the second compound semiconductor layer of the second conductive type into the same shape as the charge absorption layer, (b) the semiconductor laminated structure formation step is a step of forming the semiconductor laminated structure so as to cover the charge absorption layer, the patterned further compound semiconductor layer of the second conductive layer, and the region where the charge absorption layer is not formed, and (c) the source electrode formation step includes (i) forming, in a part of the semiconductor laminated structure, a contact hole extending to the compound semiconductor layer of the first conductive type, (ii) forming an additional electrode being in direct contact with the compound semiconductor layer of the first conductive type in the contact hole, (iii) forming a source electrode on the semiconductor laminated structure, and (iv) forming a connection electrode electrically connecting the additional electrode and the source electrode.

EMBODIMENTS OF THE INVENTION

Figure 1:
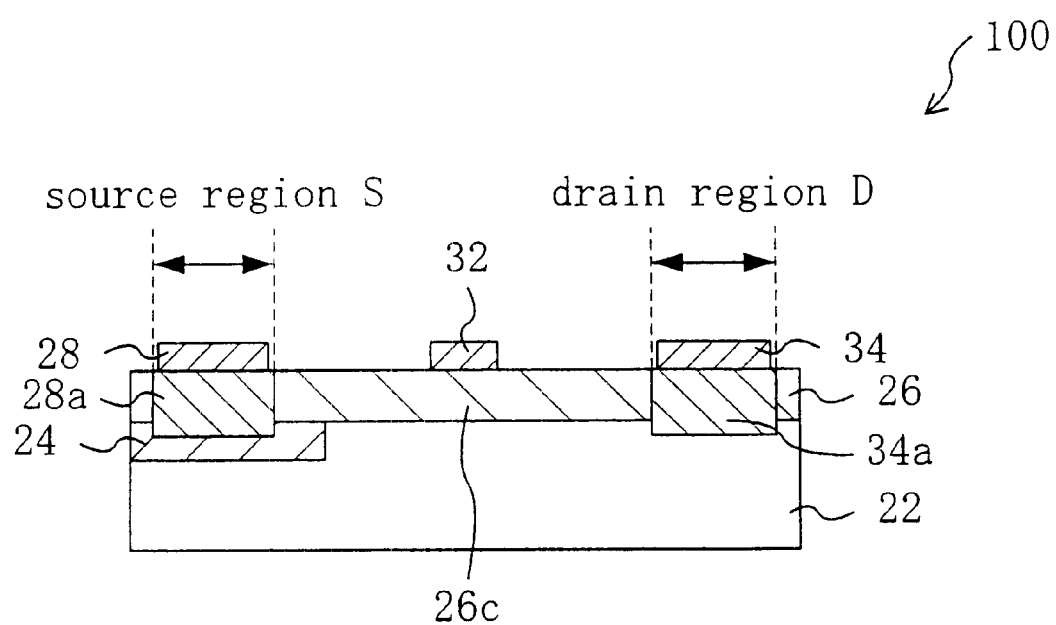
FIG. 1 illustrates in schematic form a cross section of a compound semiconductor field effect transistor 100 in a dance with a first embodiment of the present invention.

A compound FET fabricated in accordance with the present invention has a compound semiconductor substrate having a semi-insulating surface, a charge absorption layer inlcuding a compound semiconductor layer of a first conductive type formed in a part of the compound semiconductor substrate, and a semiconductor laminated structure including at least an active layer having a compound semiconductor layer of a second conductive type epitaxially grown so as to cover the charge absorption layer and a region of the semi-insulating surface where the charge absorption layer is not formed. A source electrode, formed on the semiconductor laminated structure located above the charge absorption layer, is electrically connected to the charge absorption layer. Formed on the semiconductor laminated structure located above the region where the charge absorption layer is not formed are a gate electrode and a drain electrode.

The charge absorption layer, since it includes a semiconductor layer of a different conductive type from the active layer and is electrically connected to the source electrode, is capable of (a) absorbing one of charges of an electron-hole pair created by impact ionization within the active layer (the hole when the active layer is n-type or the electron when the active layer is p-type) opposite in polarity to the other charge that functions as a carrier in the active layer and (b) emitting the absorbed charge through the source electrode to outside the FET. This accordingly controls and prevents the occurrence of a kink in the compound FET current-voltage characteristic.

Further, at least the active layer is formed by epitaxial growth. As a result, it is possible to form an active layer higher in impurity concentration and thinner in film thickness, in comparison with active layers formed by ion implantation and, in addition, it becomes possible to accurately control the concentration distribution of impurity, whereby compound FETs superior in characteristic to conventional compound FETs can be obtained. Further, an intrinsic compound semiconductor layer (a semi-insulating compound semiconductor layer) functioning as an insulating layer in a MISFET is formed by making use of an epitaxially-grown layer, which makes it possible to improve the breakdown voltage of the MISFET. Further, the charge absorption layer and the semiconductor laminated structure are formed by making use of compound semiconductor layers formed by epitaxial growth, which makes it possible to improve the electrical characteristic of compound FET to a further extent.

In the compound semiconductor, an electron is higher in mobility than a hole by 10 or more, so that an n-type compound semiconductor layer is in general used as an active layer. In the following embodiments of the present invention, compound FETs, each of which uses an n-type compound semiconductor layer as an active layer (a compound semiconductor layer of a second conductive type), will be described with regard to their structures and fabrication methods. The compound FETs of the present invention can, of course, be formed using a p-type active layer. Further, it is possible to construct a complementary type compound FET formed by a combination of a compound FET having an n-type active layer and a compound FET having a p-type active layer.

EMBODIMENT 1

Referring first to FIG. 1, there is schematically shown a cross section of a compound semiconductor field effect transistor (FET) 100 in accordance with a first embodiment of the present invention. Note that the compound FET 100 is a MESFET.

The compound FET 100 has (a) a charge absorption layer 24 (a compound semiconductor layer of a first conductive type such as a p-GaAs layer which is formed to a thickness of about 100 nm) formed on a semi-insulating compound semiconductor substrate 22 having a semi-insulating surface and (b) a semiconductor laminated structure including at least an active layer 26 (a compound semiconductor layer of a second conductive type different from the first conductive type such as an n-GaAs layer which is formed to a thickness of about 200 nm) formed so as to cover the charge absorption layer 24 and a region of the semi-insulating surface of the semi-insulating substrate 22 where the charge absorption layer 24 is not formed. The compound FET 100 has a source electrode 28 formed on the semiconductor laminated structure (the active layer 26) located above the charge absorption layer 24, and a gate and drain electrodes 32 and 34 formed on the active layer 26 located above regions of the semi-insulating surface of the semi-insulating substrate 22 where the charge absorption layer 24 is not formed. A simplest semiconductor laminated structure includes just the active layer 26, as shown in FIG. 1; however, a semiconductor laminated structure including, for example, a semi-insulating compound semiconductor layer (an intrinsic compound semiconductor layer) may be used. In the active layer 26, whereas a source region S is formed below the source electrode 28, a drain region D is formed below the drain electrode 34. Formed in the active layer 26 below the gate electrode 32 is a channel 26c. With the variation in the cross-sectional area of an under-gate depletion layer (not shown in the figure) due to the variation in the voltage that is applied to the gate electrode 32, the cross-sectional area of the channel 26c varies.

The source electrode 28 is made of, for example, a metallic material capable of forming ohmic contact between the charge absorption layer 24 and the active layer 26. The source electrode 28 is electrically connected to the charge absorption layer 24 formed under the active layer 26. The source electrode 28 and the charge absorption layer 24 are electrically connected together by the following mechanism. The source electrode 28 formed on the active layer 26 is subjected to heat treatment, wherein the metallic material of the source electrode 28 is thermally diffused to form an ohmic contact region 28a. The ohmic contact region 28a then enters into a part of the charge absorption layer 24. Current flows between the source electrode 28 and the charge absorption layer 24 through the ohmic contact region 28a.

Alternatively, current flows by the tunnel effect between the source electrode 28, the charge absorption layer 24, and the active layer 26 (through the ohmic contact region 28a). The term "ohmic contact region" in the specification includes not only a region where conduction by ohmic contact in the strict sense of the word is created, but also a region where conduction by tunnel current is created.

Formed between the drain electrode 34 and the active layer 26 is an ohmic contact region 34a. The ohmic contact region 34a enters into a part of the semi-insulating substrate 22. In the example shown in FIG. 1, the ohmic contact regions 28a and 34a have the same thickness, each of the regions extending to a layer under the active layer 26. It is possible to form the drain electrode 34 with the same material as the source electrode 28.

An example of the method of fabricating the compound FET 100 when using an n-type compound semiconductor layer as the active layer 26 will be now described below.

Figure 2A:
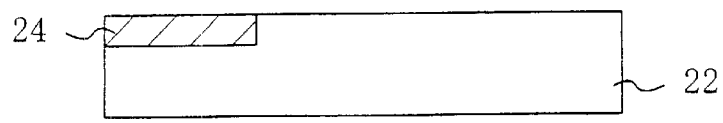
FIGS. 2A–2C are cross-sectional diagrams schematically illustrating steps of the fabrication of the compound semiconductor field effect transistor 100 of the first embodiment.

First of all, as shown in FIG. 2A, the semi-insulating substrate 22 (for example, a GaAs substrate) is provided. A part of the semi-insulating substrate 22 is selectively ion implanted with a p-type dopant to form the charge absorption layer 24 formed of a p-type compound semiconductor layer. Such p-type impurity ion implantation can be carried out by a conventional method. For example, by implantation of ions of Mg (magnesium) at an acceleration voltage of 160 keV at a dose of $4.0 \times 10^{12}$ cm$^{-2}$, an Rp (projected range) of about 200 nm, where Rp is the depth which gives a maximum concentration, can be obtained.

Figure 2B:
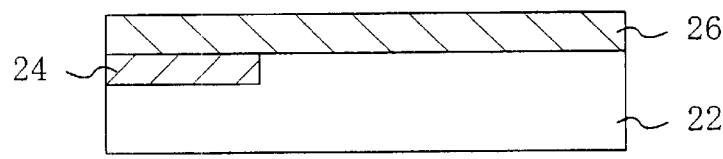

Thereafter, as FIG. 2B shows, the active layer 26 formed of an n-type compound semiconductor layer (for example, an n-GaAs layer having a thickness of about 200 nm) is epitaxially grown so as to cover the charge absorption layer 24 and a region of the surface of the semi-insulating substrate 22 where the charge absorption layer 24 is not formed. The active layer 26 can be grown epitaxially by a known technique using an MBE or MOVPE technique.

Figure 2C:
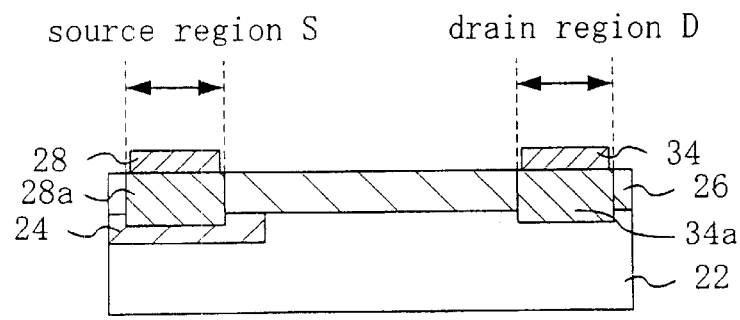

Next, as shown in FIG. 2C, a metallic material (for example, AuGe/Au) is used to form the source electrode 28 and the drain electrode 34 in predetermined regions on the active layer 26. The source electrode 28 and the drain electrode 34 are subjected to heat treatment (for example, at about 450 degrees centigrade) thereby to form the ohmic contact regions 28a and 34a. Whereas the source electrode 28 is formed overlaying the charge absorption layer 24, the drain electrode 34 is formed on the active layer 26 formed on the semi-insulating surface of the semi-insulating substrate 22. The ohmic contact region 28a on the source side extends from the source electrode 28 to a part of the charge absorption layer 24 for providing electrical connection therebetween. On the other hand, the ohmic contact region 34a on the drain side extends from the drain electrode 34 to a part of the semi-insulating substrate 22. Thereafter, for example, Al (aluminum) is used to form the gate electrode 32 in a predetermined region on the active layer 26 to complete the compound FET 100 shown in FIG. 1. Further, the gate electrode 32 Schottky-contacts with the active layer 26.

Hereinafter, other compound FETs fabricated in accordance with the present embodiment will be described by making reference to the drawing figures.

In each of the following figures, constitutional elements which are substantially equivalent in function to the compound FET 100 of FIG. 1 have been assigned the same reference numerals.

Figure 3:
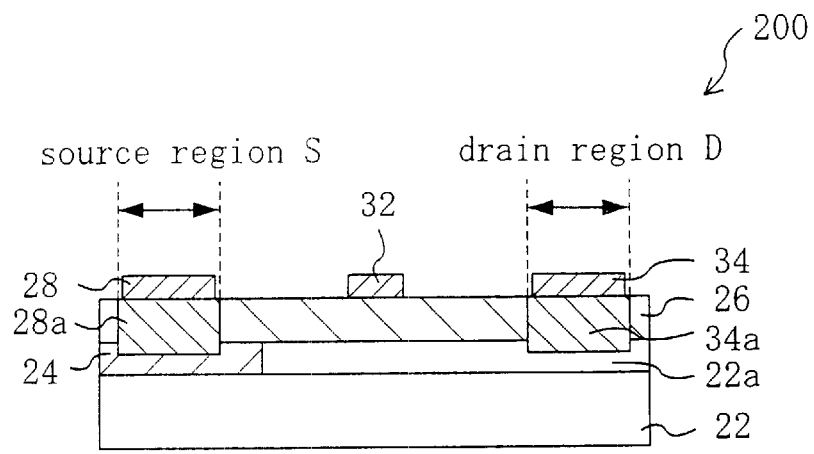
FIG. 3 illustrates in schematic form a cross section of a compound semiconductor field effect transistor 200 in accordance with the first embodiment.

Referring now to FIG. 3, there is schematically shown a cross section of a compound FET 200 fabricated in accordance with the present embodiment. The compound FET 200 additionally has, on the semi-insulating substrate 22 of the compound FET 100, a buffer layer 22a formed of a semi-insulating compound semiconductor layer. The charge absorption layer 24 is formed by, for example, ion implantation to a part of the buffer layer 22a. The remaining structure is the same as the compound FET 100. The buffer layer 22a and the semi-insulating substrate 22 in the compound FET 200 function as the semi-insulating substrate 22 in the compound FET 100. For example, the buffer layer 22a can be formed by epitaxially growing an undope GaAs layer (i-GaAs) on the semi-insulating substrate 22, after which 1S formation the same fabrication steps as the compound FET 100 are carried out. By virtue of the formation of the buffer layer 22a, there are provided effects of relaxing lattice mismatching between the semi-insulating compound semiconductor substrate 22 and the compound semiconductor layer that is epitaxially grown thereon, and improving crystallinity.

Figure 4:
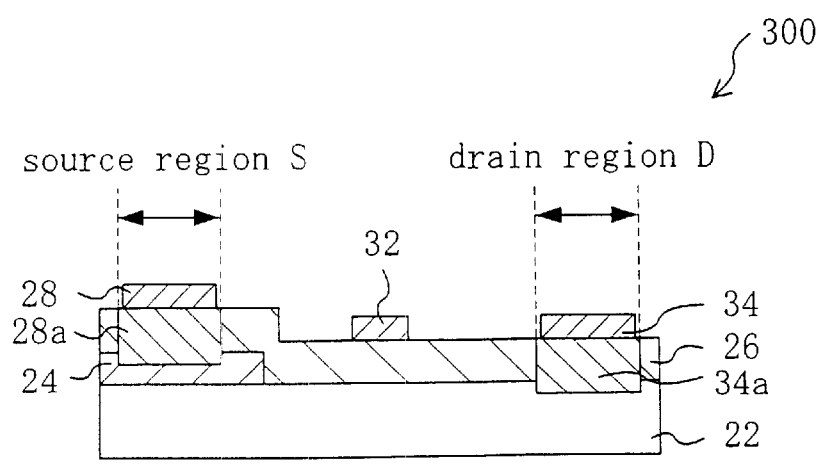
FIG. 4 illustrates in schematic form a cross section of a compound semiconductor field effect transistor 300 in accordance with the first embodiment.

Referring next to FIG. 4, there is schematically shown a cross section of a compound FET 300 fabricated in accordance with the present embodiment. The charge absorption layer 24 of the compound FET 300 is formed on the semi-insulating surface of the semi-insulating substrate 22. For example, the charge absorption layer 24 is formed by epitaxial growth of a p-type GaAs layer (p-GaAs) and then by subjecting the epitaxially grown layer to patterning by photolithography (see FIGS. 6A and 6B which are described later), after which formation the same fabrication steps as the compound FET 100 are carried out.

Figure 5A:
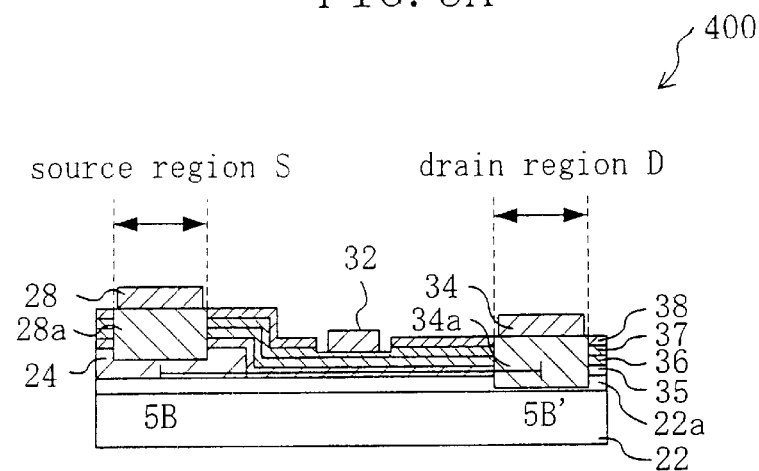
FIG. 5A illustrates in schematic form a cross section of a compound semiconductor field effect transistor 400 in accordance with the first embodiment and FIG. 5B illustrates in schematic form a band structure of a line 5B–5B' section of the compound semiconductor field effect transistor 400 shown in FIG. 5A.

Referring to FIG. 5A, there is schematically shown a cross section of a compound FET 400 fabricated in accordance with the present embodiment. Whereas the foregoing compound FETs 100, 200, and 300 are all MESFETs, the compound FET 400 is a MISFET.

The compound FET 400 has the semi-insulating substrate 22, the buffer layer 22*a* formed of a semi-insulating compound semiconductor layer, the charge absorption layer 24, a semi-insulating charge absorption layer 35 (a first semi-insulating layer), an active layer 36 formed of an n-type compound semiconductor layer, an intrinsic compound semiconductor layer 37 (a second semi-insulating layer), and a contact layer 38 formed of an $n^+$ compound semiconductor layer, these layers being formed on the semi-insulating substrate 22 in that order. The charge absorption layer 24 is formed in selective fashion on the source side and the source electrode 28 is formed above the charge absorption layer 24. On the other hand, on the drain side, a semiconductor laminated structure is formed which has on the semi-insulating surface of the semi-insulating substrate 22 the buffer layer 22*a*, the semi-insulating layer 35, the n-type active layer 36, the intrinsic semiconductor layer 37, and the contact layer 38, and the drain electrode 34 is formed on the semiconductor laminated structure. The gate electrode 32 is formed on a laminated structure having the buffer layer 22*a* formed of a semi-insulating compound semiconductor layer formed on the semi-insulating surface of the semi-insulating substrate 22, the semi-insulating layer 35, the active layer 36, and the intrinsic semiconductor layer 37. The active layer 36 and the intrinsic semiconductor layer 37 function as semiconductor and as an insulator of the MISFET, respectively.

A fabrication method of fabricating the compound FET 400 will be described by making reference to FIGS. 6A–6E.

Figure 6A:
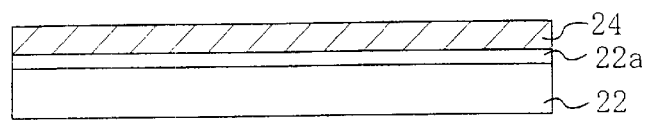
FIGS. 6A–6E are cross-sectional diagrams illustrating steps of the fabrication of the compound semiconductor field effect transistor 400 shown in FIG. 5A.

As FIG. 6A shows, as a semi-insulating compound semiconductor substrate, the GaAs substrate 22 is first provided, which is followed by epitaxial growth of the buffer layer 22*a* made of a semi-insulating compound semiconductor material on a semi-insulating surface of the GaAs substrate 22. For example, a non-dope i-GaAs layer having a thickness of about 300 nm can be used as the buffer layer 22*a*. Epitaxially grown on the buffer layer 22*a* is the charge absorption layer 24. For example, a p-GaAs layer having a thickness of about 100 nm can be used as the charge absorption layer 24.

Figure 6B:
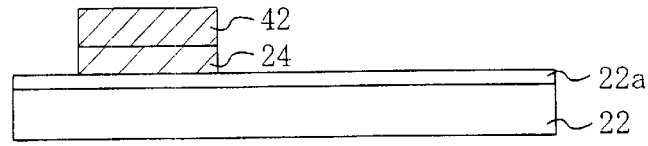

Next, as shown in FIG. 6B, a resist layer 42 having a predetermined pattern is formed by means of a photolithography technique. By making use of the resist layer 42 as a mask, the charge absorption layer 24 is subjected to selective removal by etching to form the charge absorption layer 24, while at the same time exposing other regions of the semi-insulating surface.

Figure 6C:
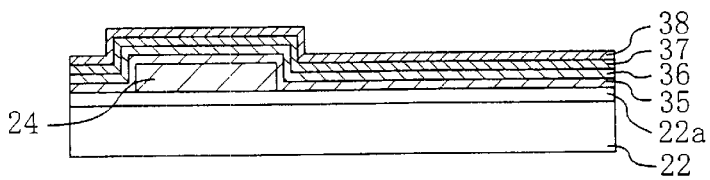

As shown in FIG. 6C, after the removal of the resist layer 42, the semi-insulating layer 35, the active layer 36, the intrinsic semiconductor layer 37, and the contact layer 38 are epitaxially grown, in that order, all over the entire surface to cover the charge absorption layer 24 and the exposed surface regions of the semi-insulating substrate 22. For example, in these layers 35–38 can be used an i-GaAs layer having a thickness of about 50 nm, an n-GaAs layer having a thickness of about 200 nm (n-type carrier concentration: about $1.0 \times 10^{18}$ cm$^{-3}$), an i-In$_{0.48}$Ga$_{0.52}$P layer having a thickness of about 20 nm, and an n-GaAs layer having a thickness of about 50 nm (n-type carrier concentration: about $3.0 \times 10^{18}$ cm$^{-3}$), respectively. It is required that the p-type impurity concentration of the p-GaAs layer 24 be set for the avoidance of complete depletion by the n-GaAs layers 36 and 38 that are deposited on the p-GaAs layer 24. It is, of course, possible to use, as the material of the intrinsic semiconductor layer 37, i-InGaP layer different in composition from i-In$_{0.48}$Ga$_{0.52}$P. Being lattice matched with GaAs, i-In$_{0.48}$Ga$_{0.52}$P is preferable.

Figure 6D:
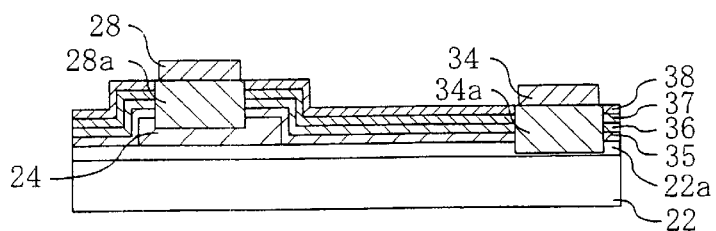

Next, as shown in FIG. 6D, the source electrode 28 and the drain electrode 34 are formed in predetermined regions on the contact layer 38 with a metallic material (for example, AuGe/Au) that establishes ohmic contact with the contact layer 38. Both the source electrode 28 and the drain electrode 34 are subjected to heat treatment (for example, at about 450 degrees centigrade) for forming their respective ohmic contact regions 28*a* and 34*a*. Whereas the source electrode 28 is formed above the charge absorption layer 24, the drain electrode 34 is formed on the region where the charge absorption layer 24 is not formed. The ohmic contact region 28*a* on the source side extends from the source electrode 28 down to a part of the charge absorption layer 24 through the contact layer 38, the intrinsic semiconductor layer 37, the active layer 36, and the semi-insulating layer 35, for establishing electrical connection between the source electrode 28 and the charge absorption layer 24. The ohmic contact region 34*a* on the drain side extends from the drain electrode 34 down to a part of the buffer layer 22*a* through the contact layer 38, the intrinsic semiconductor layer 37, the active layer 36, and the semi-insulating layer 35.

Figure 6E:
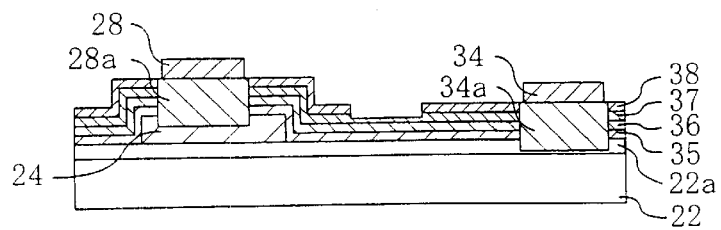

Next, in order to prevent a current from flowing in the contact layer 38 in a direction parallel with a flow of current in the active layer 36, in other words, in order to prevent the occurrence of so-called parallel conduction, as shown in FIG. 6E, the contact layer 38 present in a region where the gate electrode 32 is formed is selectively removed to such an extent that at least a corresponding surface region of the intrinsic semiconductor layer 37 is exposed. Such selective removal of the contact layer 38 can be achieved by forming a resist layer having a predetermined pattern by a photolithography technique and then by etching using the resist layer thus formed as a mask. In the example shown in FIG. 6E, the intrinsic semiconductor layer 37 under the contact layer 38 is halfway etched in its thickness direction.

Next, the gate electrode 32 is formed on the exposed intrinsic semiconductor layer 37 with, for example, Al (aluminum). As a result, the compound FET 400 shown in FIG. 5 is completed.

As described above, the compound FETs 100, 200, 300, and 400 fabricated in accordance with the present invention each have the charge absorption layer 24 in electrical connection with the source electrode 28 between the active layer 26 (or the active layer 36) under the source electrode 28 and the semi-insulating compound semiconductor substrate 22 (or the buffer layer 22*a*), whereby a hole of an electron-hole pair created by impact ionization in the active layer 26 (or the active layer 36) is absorbed in the charge absorption layer 24 and thereafter is emitted to outside the compound FET through the source electrode 28 and source wiring (not shown in the figure) connected to the source electrode 28. This accordingly controls and prevents holes which adversely affect the current-voltage characteristic of compound FETs from being accumulated in the semi-insulating substrate.

Figure 5B:
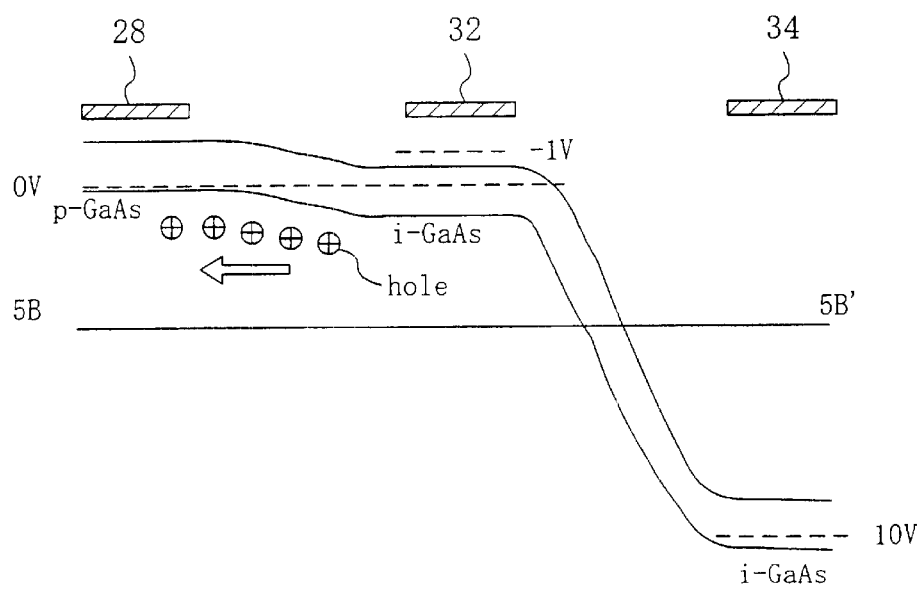

Such phenomenon will be described with reference to FIG. 5B. FIG. 5B illustrates in schematic form a band structure of a line 5B–5B' section of the compound FET 400 of FIG. 5A.

Figure 16A:
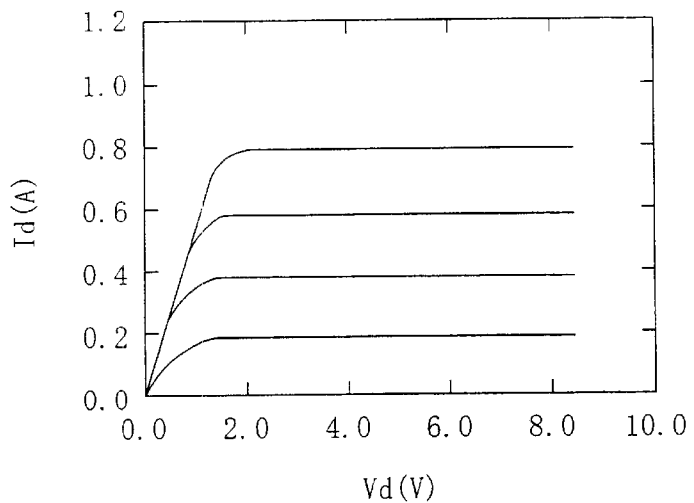
FIGS. 16A and 16B graphically illustrate compound FET I-V characteristic curves, FIG. 16A showing an ideal compound FET I-V characteristic, FIG. 16B showing an I-V characteristic curve of a conventional compound FET.
Figure 16B:
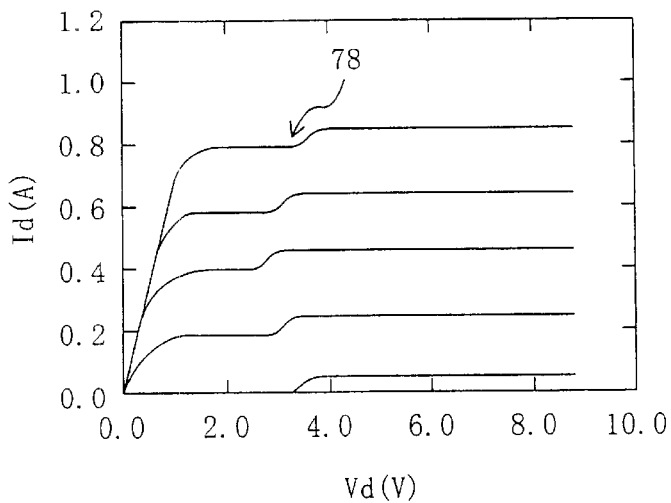
Figure 17:
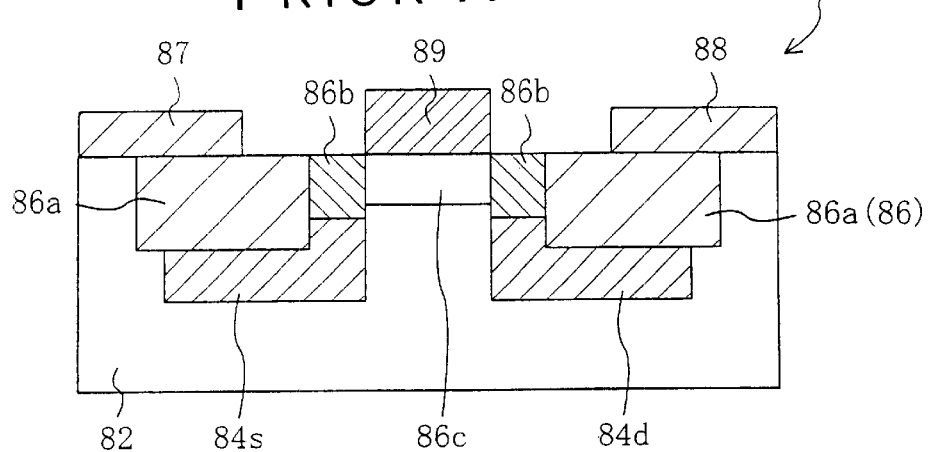
FIG. 17 illustrates in schematic form a cross section of a conventional MESFET prepared by an ion implantation process.
Figure 18:
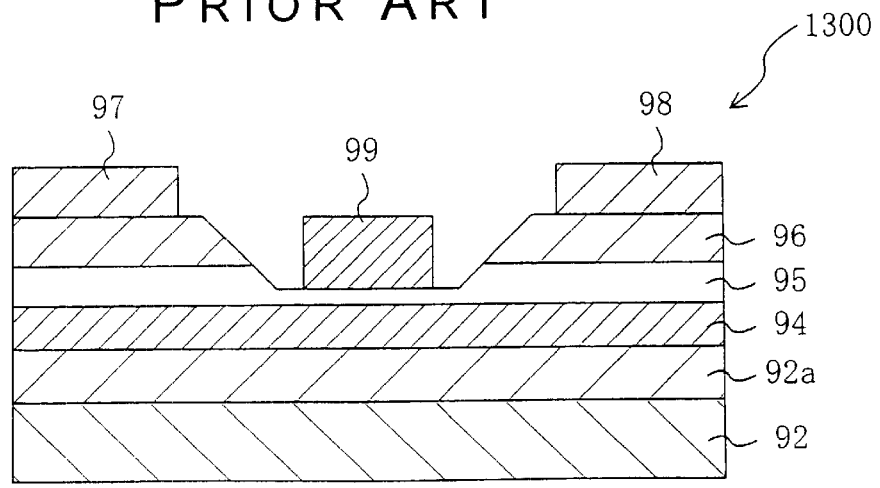
FIG. 18 illustrates in schematic form a cross section of a conventional MISFET prepared by an epitaxial growth process.
Figure 19:
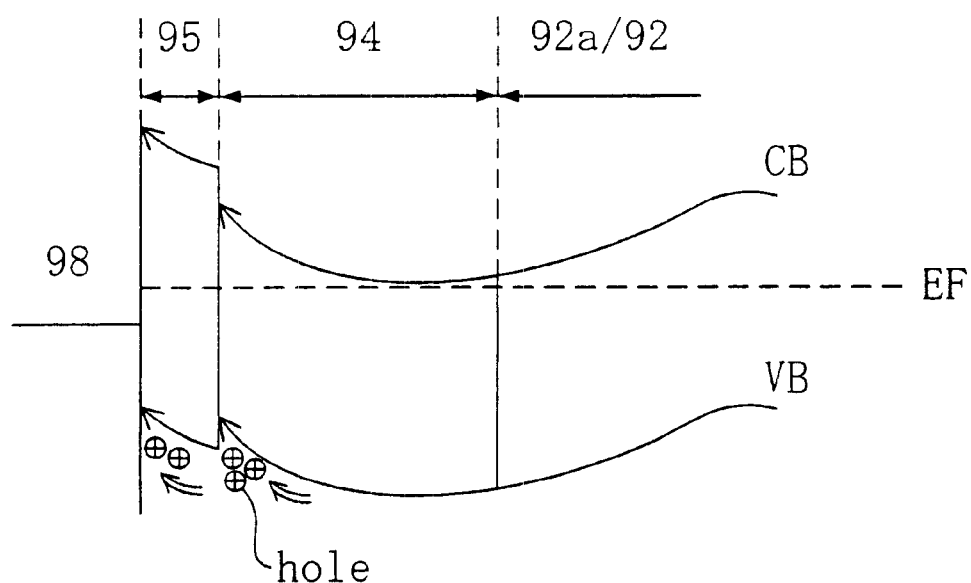
FIG. 19 schematically depicts an under-gate band structure in the MISFET shown in FIG. 18.

The bias condition of each of the electrodes in FIG. 5B is a general operating bias condition, wherein the source potential (Vs) is grounded (i.e., 0 V), the gate potential (Vg) is −1 V, and the drain potential (Vd) is 10 V. Holes, created in the active layer 26 or 36 (which is an n-type compound semiconductor layer) by impact ionization, are absorbed in the charge absorption layer 24 (they travel in a direction indicated by an arrow of FIG. 5B). Accordingly, even when an electron-hole pair is created by impact ionization, the width of a gate-source surface depletion layer remains almost unchanged and the channel cross-sectional area varies little. Therefore, as shown in FIG. 16A, the occurrence of kinks can be held low in the dependency of Id (the drain current) flowing through the channel upon Vd (the drain voltage).

EMBODIMENT 2

In a second embodiment of the present invention, in order to further ensure that the source electrode and the charge absorption layer (which is formed of a p-type compound semiconductor layer when the active layer is an n-type compound semiconductor layer) are electrically connected together, both (i) an additional electrode for establishing connection between the source electrode and the charge absorption layer and (ii) a connection electrode for establishing electrical connection between the additional electrode and the source electrode are formed.

FIGS. 7–10 schematically illustrate cross sections of compound FETs 500, 600, 700, and 800 of the present embodiment, respectively. These FETs of the present embodiment are similar in basic structure to the compound FETs 100, 200, 300, and 400 of the first embodiment, respectively, with the exception that they have a different electrode structure on the FET source side. Moreover, the compound FETs of the present embodiment are fabricated in substantially the same as the compound FETs of the first embodiment, with the exception that there are additional steps of forming an additional electrode and a connection electrode. Constitutional elements of the compound FETs of the present embodiment which are substantially equivalent in function to the compound FETs of the first embodiment have been assigned the same reference numerals and their detailed description is omitted here.

In each of the compound FETs 500, 600, 700, and 800 shown in FIGS. 7, 8, 9, and 10, the source electrode 28 is formed on the active layer 26 (the n-type compound semiconductor layer) overlying the charge absorption layer 24, forming ohmic contact with the active layer 26. The additional electrode 52 is formed on the active layer 26 located above the charge absorption layer 24, being located next to the source electrode 28. The additional electrode 52 is electrically connected to the charge absorption layer 24. Moreover, the additional electrode 52 is electrically connected to the source electrode 28 through the connection electrode 54. The source electrode 28 is formed on a side of the additional electrode 52 facing the gate electrode 32.

By virtue of the provision of the additional electrode 52, even when the ohmic contact region 28a of the source electrode 28 fails to reach the charge absorption layer 24, the source electrode 28 and the charge absorption layer 24 are electrically connected together through the additional electrode 52 and its ohmic contact region 52a. On the other hand, in the case the ohmic contact region 28a of the source electrode 28 does reach the charge absorption layer 24, the provision of the additional electrode 52 provides an effect of reducing the electrical resistance between the source electrode 28 and the charge absorption layer 24 to a further extent.

The additional electrode 52 can be formed using, for example, AuZn (eutectic alloy of Au and Zu, like AuGe). The additional electrode 52 may be formed before or after the step of forming the source electrode 28, the drain electrode 34, or the gate electrode 32. Generally, in order to form a deeper ohmic region contact, it is required to perform heat treatment at higher temperatures. Therefore, formation of the additional electrode 52 preferably precedes that of the source and drain electrodes 28 and 34. For example, after the additional electrode 52 is formed with AuZn, the ohmic contact region 52a is formed by a heat treatment carried out at about 350 degrees centigrade. Zn is liable to diffuse into a compound semiconductor of the GaAs group and is capable of forming ohmic contact at lower temperatures in comparison with the AuGe group. Thereafter, the source electrode 28 and the drain electrode 34 are formed with AuGe and heat treatment is carried out at about 450 degrees centigrade to form the ohmic contact regions 28a and 34a.

The connection electrode 54 can be formed using, for example, Ti/Au. The connection electrode 54 may be formed before or after the step of forming the gate electrode 32. It is preferred that, after the gate electrode 32 is formed, the connection electrode 54 is formed simultaneously with the step of forming source wiring (not shown in the figure) for providing source signals to the source electrode 28. In other words, employing a structure in which part of the source wiring is formed as the connection electrode 54 makes it possible to simplify the fabrication steps.

EMBODIMENT 3

Figure 11:
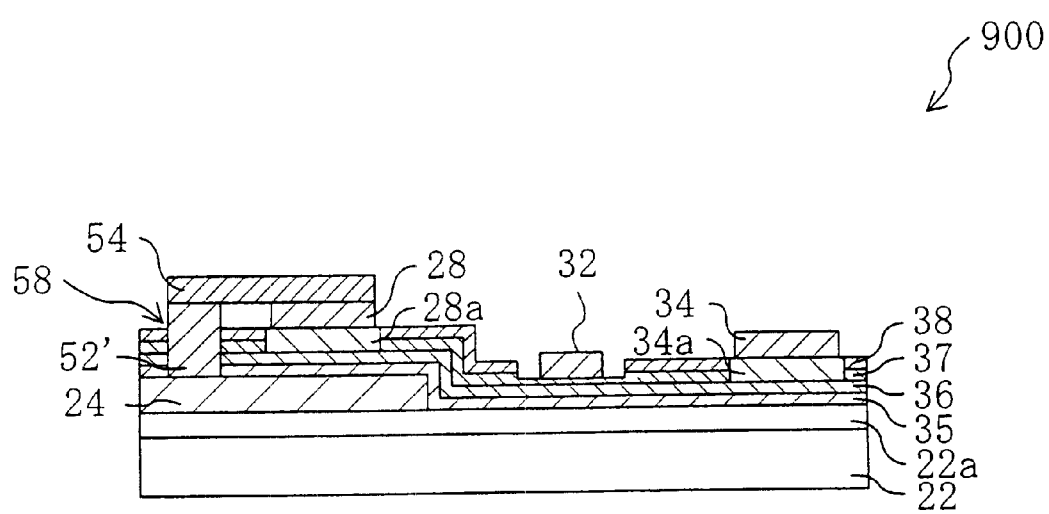
FIG. 11 illustrates in schematic form a cross section of a compound semiconductor field effect transistor 900 in accordance with a third embodiment of the present invention.

Referring to FIG. 11, there is schematically shown a cross section of a compound FET 900 fabricated in accordance with a third embodiment of the present invention. The compound FET 900 of the present embodiment, and the compound FETs of the first and second embodiment differ in terms of their source-side electrode structure. In the compound FET of the second embodiment, the additional electrode 52 and the charge absorption layer 24 are electrically connected together through the ohmic contact region 52a. On the other hand, in the compound FET of the present embodiment, a contact hole 58 is formed in a semiconductor layer (or a semiconductor laminated structure) over the charge absorption layer 24 and one end of an additional electrode 52' is electrically connected to the charge absorption layer 24 in the contact hole 58. The other end of the additional electrode 52' is electrically connected to the source electrode 28 through the connection electrode 54, as in the second embodiment.

The compound FET 900 is similar in basic structure to the compound FET 400 of the second embodiment (FIG. 5A) but has a different electrode structure on the FET source side. Moreover, the compound FET 900 is fabricated in substantially the same way as the compound FET 400 of the second embodiment, except for the steps of forming the contact hole 58 and the additional electrode 52'. Constitutional elements of the compound FET 900, which are substantially equivalent in function to the compound FET 400 of the second embodiment, have been assigned the same reference numerals and their detailed description is omitted here.

A first fabrication method of fabricating the compound FET 900 will be described below.

First of all, as shown in FIGS. 6A–6C, formed sequentially on the semi-insulating substrate 22 inclusive of the buffer layer 22a are the charge absorption layer 24, the semi-insulating layer 35, the active layer 36, the intrinsic semiconductor layer 37, and the contact layer 38.

Figure 12A:
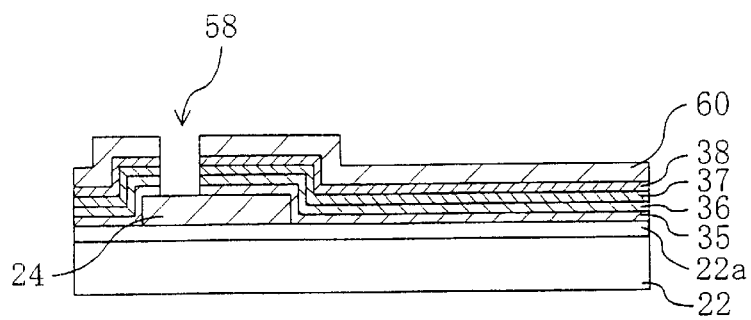
FIGS. 12A–12C are cross-sectional diagrams schematically illustrating steps of the fabrication of the compound semiconductor field effect transistor 900 shown in FIG. 11.

Next, as shown in FIG. 12A, a resist layer having an opening at a position where the contact hole 58 is formed is applied all over the surface of the substrate 22 with the foregoing layers formed thereon. Through the resist layer 60 serving as a mask, the contact layer 38, the intrinsic semiconductor layer 37, the active layer 36, and the semi-insulating layer 35 are subjected to etching to such an extent that at least the surface of the charge absorption layer 24 is exposed, thereby to form the contact hole 58. Such an etching step can be carried out by a known wet or dry etch technique.

Figure 12B:
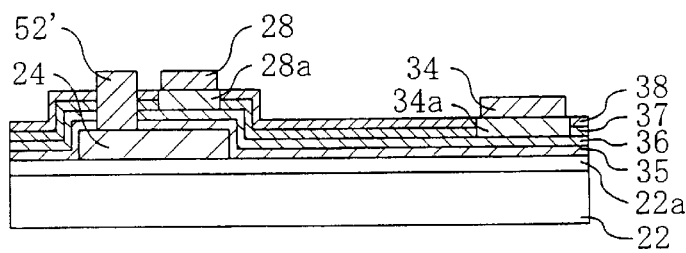

Next, as shown in FIG. 12B, after the resist layer 60 is removed, the additional electrode 52' which ohmic contacts with the charge absorption layer 24 in the contact hole 58 is formed. As shown in the figure, the contact hole 58 is not necessarily filled with the additional electrode 52'. The additional electrode 52' establishes electrical connection with the charge absorption layer 24 in at least a part in the contact hole 58, which will suffice. This is followed by forming the source and drain electrodes 28 and 34 with ohmic contact in specified regions on the contact layer 38. The source electrode 28 is formed above the charge absorption layer 24 and on the gate side (on the drain side) with respect to the additional electrode 52'. Such a fabrication step can be carried out using the same material and the same method as the step shown in FIG. 6D.

Figure 12C:
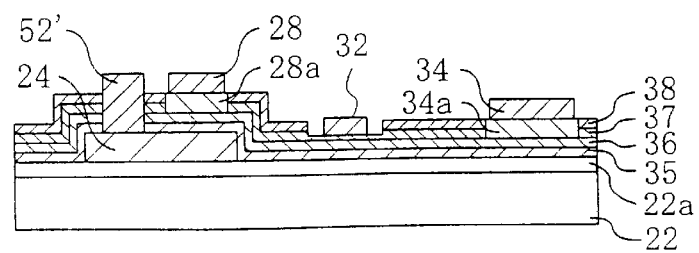

Next, like FIG. 6E, in order to prevent the occurrence of parallel conduction in the contact layer 38 (the n-GaAs layer), the contact layer 38 present in a region where the gate electrode 32 is formed is etched until the intrinsic semiconductor layer 37 is reached, or to such an extent that at least a surface of the intrinsic semiconductor layer 37 is exposed. This is followed by formation of the gate electrode 32 on the exposed surface of the intrinsic semiconductor layer 37 (see FIG. 12C).

Last of all, the connection electrode 54 for establishing electrical connection between the additional electrode 52' and the source electrode 28 is formed to complete the compound FET 900 shown in FIG. 11.

A second fabrication method of fabricating the compound FET 900 of the third embodiment will be described. The compound FET 900 can be fabricated in a different sequence from the one described with reference to FIGS. 12A–12C.

Like the foregoing first fabrication method, as shown in FIGS. 6A–6C, formed sequentially on the semi-insulating substrate 22 inclusive of the buffer layer 22a are the charge absorption layer 24, the semi-insulating layer 35, the active layer 36, the intrinsic semiconductor layer 37, and the contact layer 38.

Next, the source electrode 28 and the contact region 28a, and the drain electrode 34 and the contact region 34a are formed. Thereafter, the contact layer 38 present in a region where the additional electrode 52' is formed, the intrinsic semiconductor layer 37, the active layer 36, and the semi-insulating layer 35 are subjected to etching to form the contact hole 58. Moreover, the contact layer 38 present in a region where the gate electrode 32 is formed is etched until the intrinsic semiconductor layer 37 is reached, or to such an extent that at least a surface of the intrinsic semiconductor layer 37 is exposed. These etching steps of etching the contact layer 38 in the regions used for the formation of the gate and additional electrodes 32 and 52' can be carried out in the same step.

Next, for example, titanium (Ti)/platinum (Pt)/gold (Au) is vapor deposited to form the additional electrode 52' and the gate electrode 32. By making use of Ti/Pt/Au as the material to form these electrodes 52' and 32, ohmic contact is formed between the first semiconductor layer 24 of, for example, p-GaAs and the additional electrode 52', and Schottky contact is formed between the intrinsic semiconductor layer 37 of, for example, i-In$_{0.48}$Ga$_{0.52}$P and the gate electrode 32.

The use of the second fabrication method makes it possible to form the gate electrode 32 and the additional electrode 52' in the same step, thereby providing an advantage of simplifying the fabrication steps.

In accordance with the compound FET 900 of the third embodiment, even when the ohmic contact region 28a of the source electrode 28 fails to reach the charge absorption layer 24, the source electrode 28 and the charge absorption layer 24 are electrically connected together through the additional electrode 52', like the compound FETs of the second embodiment. Furthermore, in the compound FET 900, the additional electrode 52' is formed in such a way as to be in direct contact with an exposed surface of the charge absorption layer 24 in the contact hole 58, therefore ensuring the electrical connection between the additional electrode 52' and the charge absorption layer 24 to a further extent in comparison with the compound FETs of the second embodiment.

Figure 7:
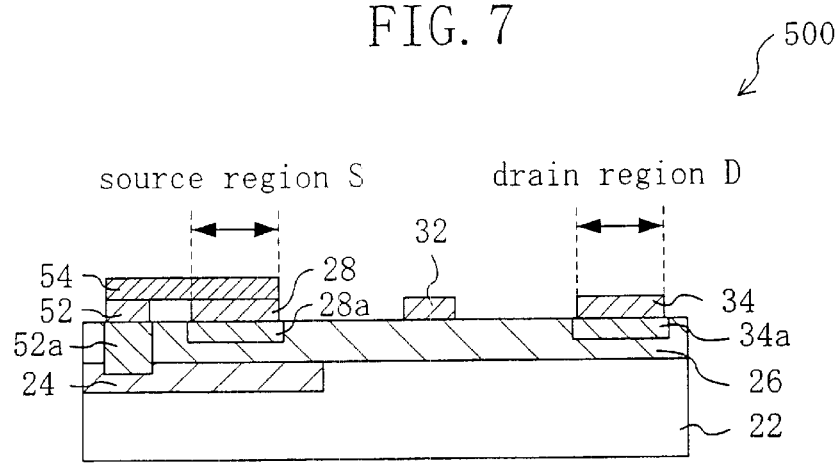
FIG. 7 illustrates in schematic form a cross section of a compound semiconductor field effect transistor 500 in accordance with a second embodiment of the present invention.
Figure 8:
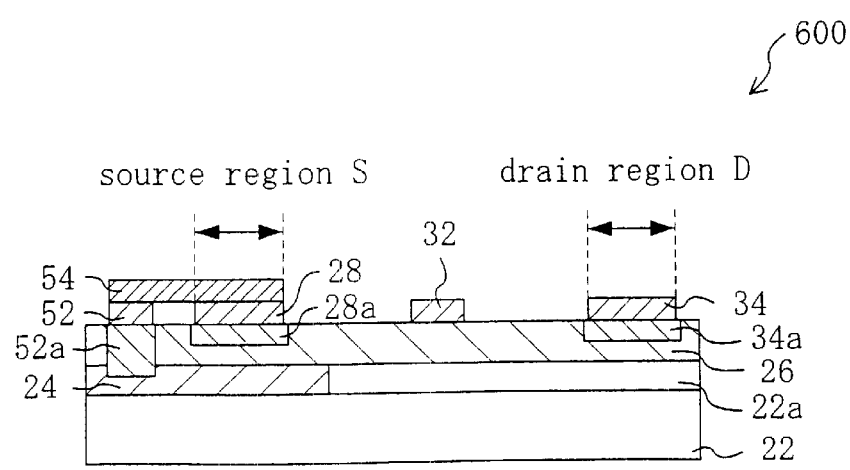
FIG. 8 illustrates in schematic form a cross section of a compound semiconductor field effect transistor 600 in accordance with the second embodiment.
Figure 9:
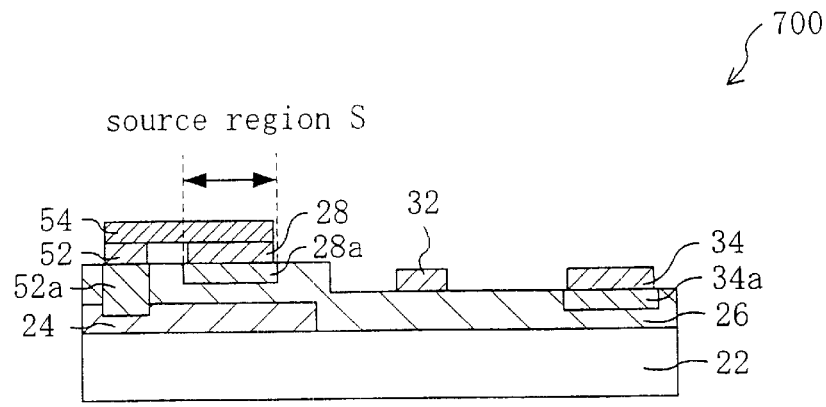
FIG. 9 illustrates in schematic form a cross section of a compound semiconductor field effect transistor 700 in accordance with the second embodiment.
Figure 10:
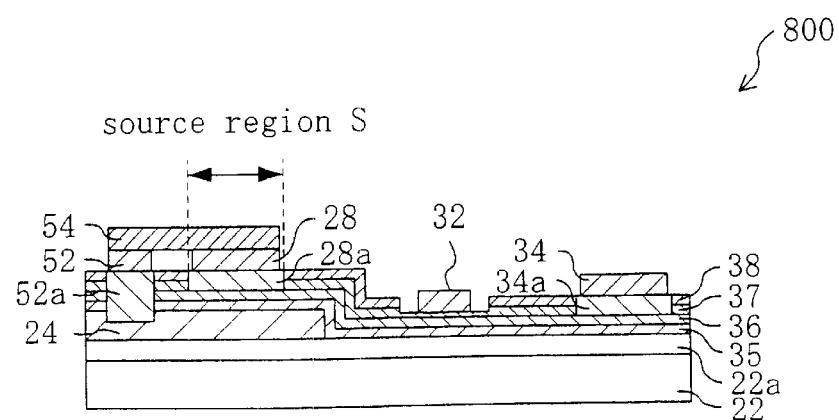
FIG. 10 illustrates in schematic form a cross section of a compound semiconductor field effect transistor 800 in accordance with the second embodiment.

In addition to the structure shown in FIG. 11, the compound FET of the third embodiment can employ the structures of the compound FETs of the second embodiment shown in FIGS. 7–9. More concretely, another compound FET of the third embodiment can be obtained by replacing the additional electrode 52 and the ohmic contact region 52a in each compound FET 500, 600, and 700 by the additional electrode 52' that is formed in the contact hole 58.

Like the compound FETs of the first and second embodiments, the compound FET of the third embodiment undergoes no kinks in its current-voltage characteristic, whereby highly reliable operations can be obtained.

EMBODIMENT 4

Figure 13:
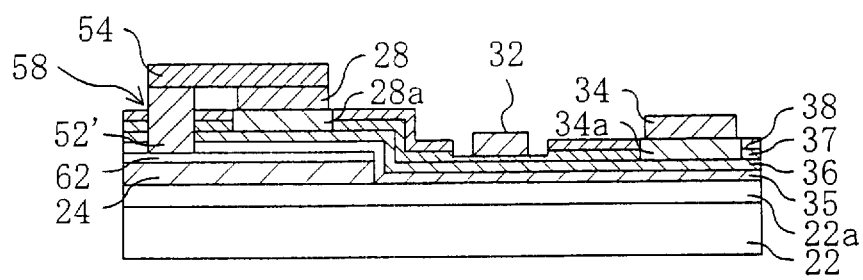
FIG. 13 illustrates in schematic form a cross section of a compound semiconductor field effect transistor 1000 in accordance with a fourth embodiment of the present invention.

Referring to FIG. 13, there is schematically shown a cross section of a compound FET 1000 fabricated in accordance with a fourth embodiment of the present invention. The compound FET 1000 differs from the compound FET 900 of the third embodiment in that it has a semiconductor layer 62 opposite in conductive type to a semiconductor layer of which the charge absorption layer 24 is formed. Constitutional elements of the compound FET 1000, which are substantially equivalent in function to the compound FET 900, have been assigned the same reference numerals and their detailed description is omitted here.

The compound FET 1000 having, on the charge absorption layer 24, the n-type compound semiconductor layer 62 opposite in conductive type to the charge absorption layer 24 can be formed in the following way.

As shown in FIG. 6A, the charge absorption layer 24 comprising a p-type compound semiconductor layer (for example, a p-GaAs layer having a thickness of about 50 nm) is deposited on a semi-insulating surface of the semi-insulating substrate 22 inclusive of the buffer layer 22a. The n-type compound semiconductor layer 62 (for example, an n-GaAs layer having a thickness of about 50 nm) is epitaxially grown on the charge absorption layer 24. Thereafter, in the same way as FIG. 6B, a photolithography technique is used to pattern the n-type compound semiconductor layer 62 and the charge absorption layer 24 into the same shape.

Thereafter, the contact hole 58, the additional electrode 52', the source electrode 28, the gate electrode 32, the drain electrode 34, and the connection electrode 54 are formed according to either the first or second fabrication methods of the third embodiment, to complete the compound FET 1000.

Figure 14:
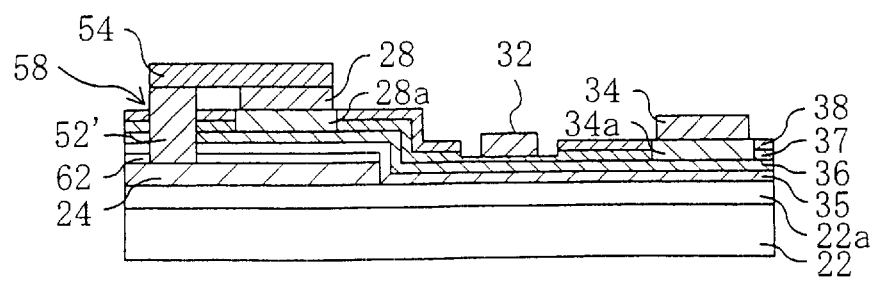
FIG. 14 illustrates in schematic form a cross section of a compound semiconductor field effect transistor 1100 in accordance with the fourth embodiment.
Figure 15A:
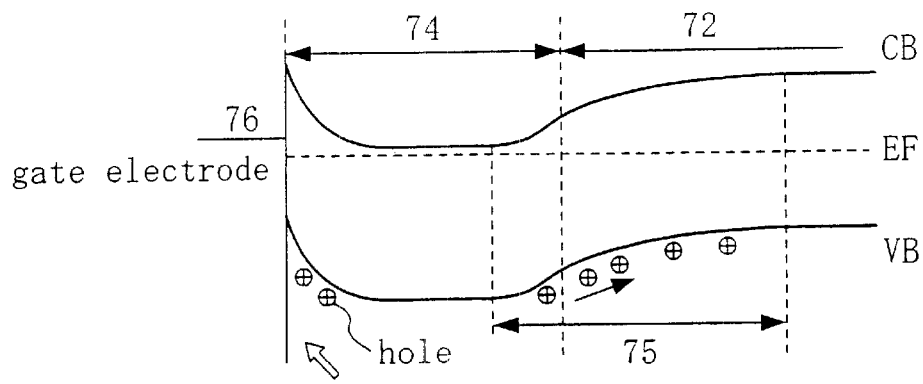
FIGS. 15A and 15B schematically illustrate gate-substrate band structures in conventional MESFETs formed by ion implantation.
Figure 15B:
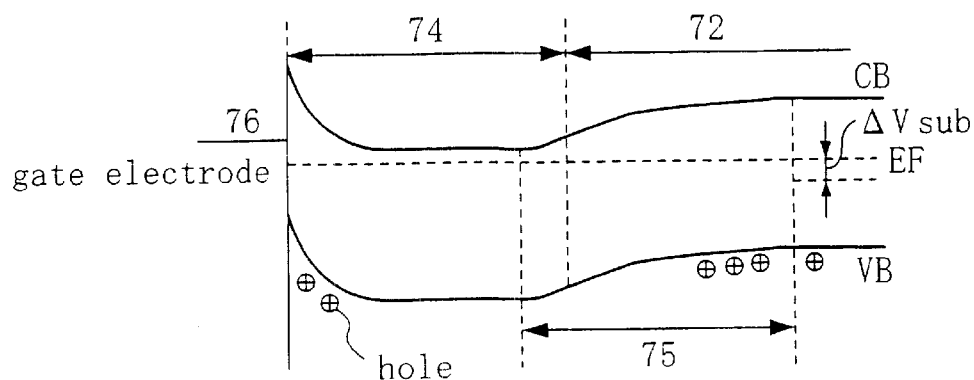

In the compound FET 1000 shown in FIG. 13, the contact hole 58 is formed such that a surface of the n-type compound semiconductor layer 62 is exposed and the additional electrode 52' is formed so as to be in contact with the n-type compound semiconductor layer 62; however, an arrangement may be made in which, like a compound FET 1100 shown in FIG. 14, the contact hole 58 is formed such that at least a surface of the charge absorption layer 24 is exposed and the additional electrode 52' is formed so as to be in direct contact with the charge absorption layer 24.

Like the compound FETs of the previously described embodiments, also in the compound FET of the fourth embodiment the charge absorption layer 24 exists under the source electrode, so that the width of a gate-source surface depletion layer varies little after an occurrence of impact ionization, thereby controlling and preventing the creation of a kink from taking place in the current-voltage curve.

Furthermore, if the n-type impurity concentration of the n-type compound semiconductor layer 62 formed on the charge absorption layer 24 comprising a p-type compound semiconductor layer is made sufficiently high, this arrangement makes it possible to prevent the creation of a depletion layer on the side of the charge absorption layer 24 of the active layer 36 even when the p-type impurity concentration of the charge absorption layer 24 is high, therefore further preventing a rise in the source resistance (i.e., the electrical resistance between the active layer 36 and the source electrode 28). As a result, the compound FET of the present embodiment is particularly able to secure a sufficient gain even when operated in high frequency regions.

The structure of the compound FET of the present embodiment is not limited to the ones shown in FIGS. 13 and 14. Another compound FET of the present embodiment can be obtained by forming an n-type compound semiconductor layer on the charge absorption layer 24 of each of the previously described first to third embodiments. In other words, by forming on a charge absorption layer (a p-type compound semiconductor layer) a further semiconductor layer (an n-type semiconductor layer) of an opposite conductive type to the charge absorption layer, it becomes possible to control and prevent the creation of a depletion layer in the active layer with the aid of such a further semiconductor layer formed on the charge absorption layer, even when the impurity (p-type) concentration of the charge absorption layer is high. This makes it possible to control the creation of a kink in the compound FET current-voltage characteristic while reducing source resistance. Accordingly, it becomes possible to realize a FET for large power amplification capable of securing sufficient gain and output in operations in a high frequency region.

Although the MISFETs described in the first to fourth embodiments each have a gate electrode on the intrinsic compound semiconductor layer (the i-$In_{0.48}Ga_{0.52}P$ layer) and an InGap/GaAs heterojunction, the present invention is applicable to a compound FET having a different structure. For example, in a compound FET without a heterojunction, in a compound FET having a compound semiconductor layer other than InGaP and GaAs, and in a junction type FET with a gate structure using a p-n junction, the same effects as in the first to fourth embodiments can be obtained by forming under an n-type conduction layer a p-type compound semiconductor layer capable of absorbing holes created in an n-type compound semiconductor layer.

Although in the compound FETs of the above-described embodiments the charge absorption layer (which is a p-type semiconductor layer) is formed, only on the source side, it (the charge absorption layer) may exist under the active layer located under the gate electrode. However, in the case the charge absorption layer is formed under the active layer underlying the drain electrode, there is no movement of holes towards the drain because in a FET having an n-type active layer a positive voltage is applied to the drain side, as a result of which there is obtained no effect of removing holes.

The present invention provides a compound FET that has a charge absorption layer (which is typically a p-type compound semiconductor layer) under an active layer (which is typically an n-type compound semiconductor layer), as a result of which, even when an electron-hole pair is created by impact ionization in the active layer, the charge absorption layer absorbs an unnecessary charge (a charge of the electron-hole pair that does not function as a carrier, typically a hole). Accordingly, the variation in the width of a gate-source surface depletion layer caused by such unnecessary charges is controlled and prevented from taking place. As a result, the creation of a kink in the compound FET current-voltage characteristic is controlled and prevented from taking place.

Further, the active layer is formed by epitaxial growth, which makes it possible to form a layer higher in impurity concentration and thinner in thickness in comparison with active layers formed by ion implantation and, in addition, it is possible to accurately control impurity concentration. Accordingly, compound FETs superior in characteristic to conventional compound FETs can be obtained. Particularly, by forming an intrinsic compound semiconductor layer (which is a semi-insulating compound semiconductor layer) functioning as an insulating layer in MISFET by the use of an epitaxially grown layer, it becomes possible to improve the breakdown voltage of compound FETs. Furthermore, by the use of semiconductor layers formed by epitaxial growth as a charge absorption layer or a semiconductor laminated structure, it becomes possible to further improve the characteristic of FETs.

Accordingly, the present invention provides a compound FET that is preferably used as a high breakdown voltage FET for high power amplification and a method for the fabrication thereof.

What is claimed is:

1. A compound semiconductor field effect transistor comprising;

a compound semiconductor substrate having a semi-insulating surface:

a charge absorption layer including a compound semiconductor layer of a first conductive type formed in a part of the compound semiconductor substrate;

a semiconductor laminated structure including at least an active layer having a compound semiconductor layer of a second conductive type epitaxially grown so as to cover the charge absorption layer and a region of the semi-insulating surface where the charge absorption layer is not formed;

a source electrode formed on the semiconductor laminated structure located above the charge absorption layer, the source electrode being electrically connected to the charge absorption layer;

a drain electrode formed on the semiconductor laminated structure located above the region where the charge absorption layer is not formed;

a gate electrode formed between the source electrode and the drain electrode; and a further compound semiconductor layer of the second conductive type formed on the charge absorption layer, wherein the semiconductor laminated structure is formed so as to cover the charge absorption layer, the further compound semiconductor layer of the second conductive type, and the region where the charge absorption layer is not formed.

2. The compound semiconductor field effec transistor of claim 1 further comprising:

an additional electrode formed on the semiconductor laminated structure;

an ohmic contact region extending from the additional electrode to the charge absorption layer through the semiconductor laminated structure; and a connection electrode electrically connecting the additional electrode and the source electrode.

3. The compound semiconductor field effect transistor of claim 1 further comprising:

a contact hole formed in a part of the semiconductor laminated structure, the contact hole extending to the charge absorption layer;

an additional electrode electrically connected to the charge absorption layer in the contact hole; and a connection electrode electrically connecting the additional electrode and the source electrode.

* * * * *

UNITED STATES PATENT AND TRADEMARK OFFICE
CERTIFICATE OF CORRECTION

PATENT NO.     : 6,429,471 B1
DATED          : August 6, 2002
INVENTOR(S)    : Takahiro Yokoyama et al.

It is certified that error appears in the above-identified patent and that said Letters Patent is hereby corrected as shown below:

Column 20,
Line 6, claim 2 should read:

2. The compound semiconductor field effect transistor of claim 3 further comprising:
a contact hole formed in a part of the semiconductor laminated structure, the contact hole extending to the charge absorption layer;
an additional electrode electrically connected to the charge absorption layer in the contact hole; and
a connection electrode electrically connecting the additional electrode and the source electrode.

Signed and Sealed this

Twenty-fourth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO. : 6,429,471 B1  
APPLICATION NO. : 09/578712  
DATED : August 6, 2002  
INVENTOR(S) : Takahiro Yokoyama et al.

Page 1 of 1

It is certified that error appears in the above-identified patent and that said Letters Patent is hereby corrected as shown below:

Col. 20, lines 6-15, claim 2 should read:

2. The compound semiconductor field effect transistor of claim 1 further comprising:

an additional electrode formed on the semiconductor laminated structure;

an ohmic contact region extending from the additional electrode to the charge absorption layer through the semiconductor laminated structure; and a connection electrode electrically connecting the additional electrode and the source electrode.

This certificate supersedes the Certificate of Correction issued December 24, 2002.

Signed and Sealed this

Fifth Day of October, 2010

David J. Kappos  
*Director of the United States Patent and Trademark Office*